United States Patent
Lint et al.

[11] Patent Number: 6,005,463
[45] Date of Patent: Dec. 21, 1999

[54] THROUGH-HOLE INTERCONNECT DEVICE WITH ISOLATED WIRE-LEADS AND COMPONENT BARRIERS

[75] Inventors: James D. Lint, Cardiff; Aurelio J. Gutierrez, Bonita; Victor H. Renteria, Poway, all of Calif.

[73] Assignee: Pulse Engineering, San Diego, Calif.

[21] Appl. No.: 08/791,247

[22] Filed: Jan. 30, 1997

[51] Int. Cl.⁶ .................. H01F 27/02; H01F 27/06; H01F 27/29

[52] U.S. Cl. .................. 336/65; 336/92; 336/96; 336/192; 336/229; 361/807; 361/809

[58] Field of Search .................. 336/65, 90, 92, 336/96, 192, 229; 361/807, 809

[56] References Cited

U.S. PATENT DOCUMENTS

| | | |
|---|---|---|
| 2,945,163 | 7/1960 | Kilby et al. . |
| 3,184,532 | 5/1965 | Spera . |
| 3,845,435 | 10/1974 | Georgopulos ............ 336/65 |
| 3,950,269 | 4/1976 | Setterquist . |
| 4,084,210 | 4/1978 | Forrest . |
| 4,188,470 | 2/1980 | Collina et al. . |
| 4,299,936 | 11/1981 | Candlin et al. . |
| 4,324,691 | 4/1982 | Hartshorn et al. . |
| 4,402,135 | 9/1983 | Schweingruber et al. . |
| 4,415,607 | 11/1983 | Denes et al. . |
| 4,530,914 | 7/1985 | Ewen et al. . |
| 4,532,152 | 7/1985 | Elarde . |
| 4,536,484 | 8/1985 | Lacombe et al. . |
| 4,540,907 | 9/1985 | Hagenlocher et al. . |
| 4,591,220 | 5/1986 | Impey . |
| 4,604,799 | 8/1986 | Gurol . |
| 4,631,639 | 12/1986 | Biraud . |
| 4,658,078 | 4/1987 | Slaugh et al. . |
| 4,665,047 | 5/1987 | Slaugh et al. . |
| 4,668,328 | 5/1987 | Kyytsönen . |
| 4,688,867 | 8/1987 | Reichardt . |
| 4,689,103 | 8/1987 | Elarde . |
| 4,694,572 | 9/1987 | Leber et al. . |
| 4,710,552 | 12/1987 | Bachl et al. . |
| 4,748,405 | 5/1988 | Brodzik et al. . |
| 4,752,597 | 6/1988 | Turner . |
| 4,769,510 | 9/1988 | Kaminsky et al. . |
| 4,791,248 | 12/1988 | Oldenettel . |
| 4,794,096 | 12/1988 | Ewen . |
| 4,812,950 | 3/1989 | Oyamada . |
| 4,814,540 | 3/1989 | Watanabe et al. . |
| 4,821,152 | 4/1989 | Lorenzen . |
| 4,870,751 | 10/1989 | Antoon . |
| 4,871,704 | 10/1989 | Kohara et al. . |
| 4,886,686 | 12/1989 | Muenstedt . |
| 4,912,075 | 3/1990 | Chang . |
| 4,912,288 | 3/1990 | Atkinson et al. . |

(List continued on next page.)

FOREIGN PATENT DOCUMENTS

| | | |
|---|---|---|
| 0515132 | 11/1992 | European Pat. Off. . |
| 0516458 | 12/1992 | European Pat. Off. . |

*Primary Examiner*—Thomas J. Kozma
*Attorney, Agent, or Firm*—Knobbe, Martens, Olson & Bear, LLP

[57] ABSTRACT

A device for electrically interconnecting the wire leads of various electronic elements within a microminiature package. A non-conducting base member having a plurality of electronic element barriers and wire lead through-holes is provided. The through-holes are generally located within the interior regions of the base element to minimize potentially detrimental field interactions or capacitive coupling between the leads and the external package terminals. During package assembly, the electronic elements are placed within recesses created within the base member by the aforementioned barriers. These recesses and barriers align the elements and help maintain electrical separation and uniformity during manufacturing. The wire leads from two or more elements are interconnected by twisting them together and inserting them into one of the through-holes. The leads are inserted into the through-holes such that they protrude below the bottom surface of the base element, thereby facilitating soldering of all such connections in a single process step. This arrangement reduces manufacturing and labor costs and increases component and overall package reliability.

13 Claims, 7 Drawing Sheets

U.S. PATENT DOCUMENTS

| | | |
|---|---|---|
| 4,914,253 | 4/1990 | Chang . |
| 4,923,833 | 5/1990 | Kioka . |
| 4,925,821 | 5/1990 | Chang . |
| 4,931,517 | 6/1990 | Fujita . |
| 4,933,403 | 6/1990 | Kaminsky et al. . |
| 4,935,397 | 6/1990 | Chang . |
| 4,937,217 | 6/1990 | Chang . |
| 4,937,301 | 6/1990 | Chang . |
| 4,962,248 | 10/1990 | Winter et al. . |
| 4,962,262 | 10/1990 | Winter et al. . |
| 4,985,600 | 1/1991 | Heerman . |
| 4,996,391 | 2/1991 | Schmidt . |
| 5,001,205 | 3/1991 | Hoel . |
| 5,003,693 | 4/1991 | Atkinson et al. . |
| 5,006,500 | 4/1991 | Chang . |
| 5,008,228 | 4/1991 | Chang . |
| 5,008,496 | 4/1991 | Schmidt et al. . |
| 5,015,981 | 5/1991 | Lint et al. . |
| 5,023,388 | 6/1991 | Lüker . |
| 5,026,797 | 6/1991 | Takahashi . |
| 5,042,146 | 8/1991 | Watson . |
| 5,043,515 | 8/1991 | Slaugh et al. . |
| 5,055,438 | 10/1991 | Canich . |
| 5,057,475 | 10/1991 | Canich et al. . |
| 5,066,631 | 11/1991 | Sangokoya et al. . |
| 5,086,024 | 2/1992 | Crapo et al. . |
| 5,086,135 | 2/1992 | Kissin . |
| 5,087,788 | 2/1992 | Wu . |
| 5,091,352 | 2/1992 | Kioka et al. . |
| 5,118,903 | 6/1992 | Schupp et al. . |
| 5,126,303 | 6/1992 | Resconi et al. . |
| 5,132,262 | 7/1992 | Rieger et al. . |
| 5,132,381 | 7/1992 | Winter et al. . |
| 5,141,829 | 8/1992 | Dumas et al. . |
| 5,145,819 | 9/1992 | Winter et al. . |
| 5,147,949 | 9/1992 | Chang . |
| 5,157,008 | 10/1992 | Sangokoya et al. . |
| 5,171,799 | 12/1992 | Kioka et al. . |
| 5,171,871 | 12/1992 | Miyashita . |
| 5,171,919 | 12/1992 | Watanabe et al. . |
| 5,176,254 | 1/1993 | Caravona . |
| 5,178,976 | 1/1993 | Rose et al. . |
| 5,196,496 | 3/1993 | Galimberti et al. . |
| 5,198,399 | 3/1993 | Hoff et al. . |
| 5,206,197 | 4/1993 | Campbell, Jr. . |
| 5,206,199 | 4/1993 | Kioka et al. . |
| 5,208,304 | 5/1993 | Waymouth . |
| 5,216,095 | 6/1993 | Dolle et al. . |
| 5,223,465 | 6/1993 | Ueki et al. . |
| 5,225,500 | 7/1993 | Elder et al. . |
| 5,234,878 | 8/1993 | Tsutsui et al. . |
| 5,238,891 | 8/1993 | Miro . |
| 5,238,892 | 8/1993 | Chang . |
| 5,240,894 | 8/1993 | Burkhardt et al. . |
| 5,241,025 | 8/1993 | Hlatky et al. . |
| 5,242,876 | 9/1993 | Shamshoum et al. . |
| 5,402,321 | 3/1995 | Izu et al. . |
| 5,455,741 | 10/1995 | Wai et al. . |

THROUGH-HOLE INTERCONNECT DEVICE WITH ISOLATED WIRE-LEADS AND COMPONENT BARRIERS

BACKGROUND OF THE INVENTION

1. Field of the Invention

The present invention relates generally to non-semiconductor electrical and electronic elements used in printed circuit board applications and particularly to an improved package and method of packaging microminiature electronic components.

2. Description of Related Technology

Dual in-line chip carrier packages (DIPs) are well known in the field of electronics. A common example of a DIP is an integrated circuit, which is typically bonded to a ceramic carrier and electrically connected to a lead frame providing opposed rows of parallel electrical leads. The integrated circuit and ceramic carrier are normally encased in a black, rectangular plastic housing from which the leads extend.

The continuing miniaturization of electrical and electronic elements and high density mounting thereof have created increasing challenges relating to electrical isolation and mechanical interconnection. In particular, substantial difficulty exists in establishing reliable and efficient connections between fine gauge (AWG24 to AWG50) copper wire leads associated with various electronic elements within a given DIP. Presently known interconnect methods severely limit the ability to provide dense and reliable electrical connections or electrical isolation of such leads from DIP egress terminals.

One common prior art approach to electrically interconnecting two or more element leads is to manually form the connection or joint by twisting the wires together. The joint may then be individually soldered or sealed to make the connection more permanent. This technique requires significant labor in that each connection must be manually formed and soldered. Furthermore, such an arrangement requires space that is not always available in such microminiature packages, and often does not allow adequate electrical separation for the comparatively high voltages that may be carried in the circuit and the egress terminals. Another problem with this approach is that element leads are frequently broken or sheared during the subsequent package encapsulation process since they are not adequately captured or protected. The leads may also break as the result of thermal expansion and contraction.

Figure 1:
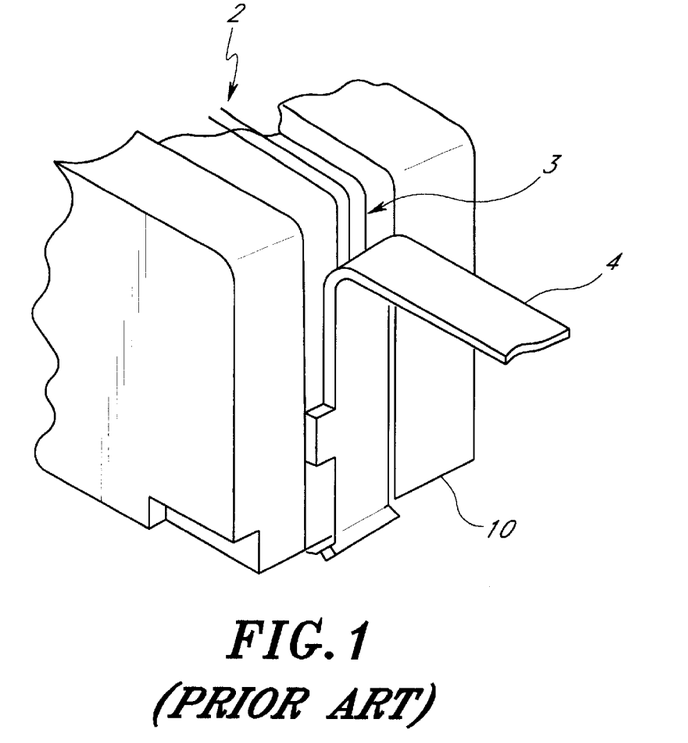
FIG. 1 is a perspective view of a prior art microelectronic packaging device illustrating the electrical interconnection of component leads using the DIP egress terminal and slot.

A second prior art method of connecting element leads to the leadframe terminals (or interconnecting the leads of two or more electronic elements) is disclosed in U.S. Pat. No. 5,015,981, which is illustrated herein as FIG. 1. This method involves routing the lead(s) 2 to an unused leadframe slot 3 located at the edge of the non-conducting base member 10, as shown in FIG. 1. Each of these slots is designed to receive a single conductive leadframe egress terminal element 4, which when assembled asserts an inward bias on the package thereby forcing contact between the conductive terminal element 4 of the leadframe and the electronic element lead(s) 2. However, this method suffers many of the same disabilities as the method previously described, since the wires must be routed to the edge of the package in proximity to the egress terminals. Such an arrangement also makes the connections susceptible to capacitive coupling or field effects relating to the egress terminals.

Figure 2:
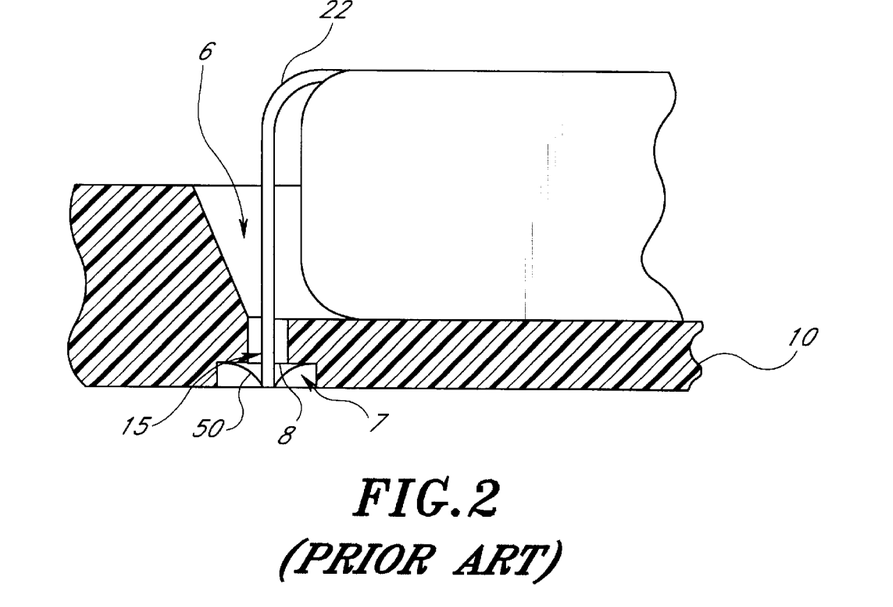
FIG. 2 is a vertical crossectional view of a prior art interconnect device illustrating the details of a through-hole terminal connection.
Figure 3:
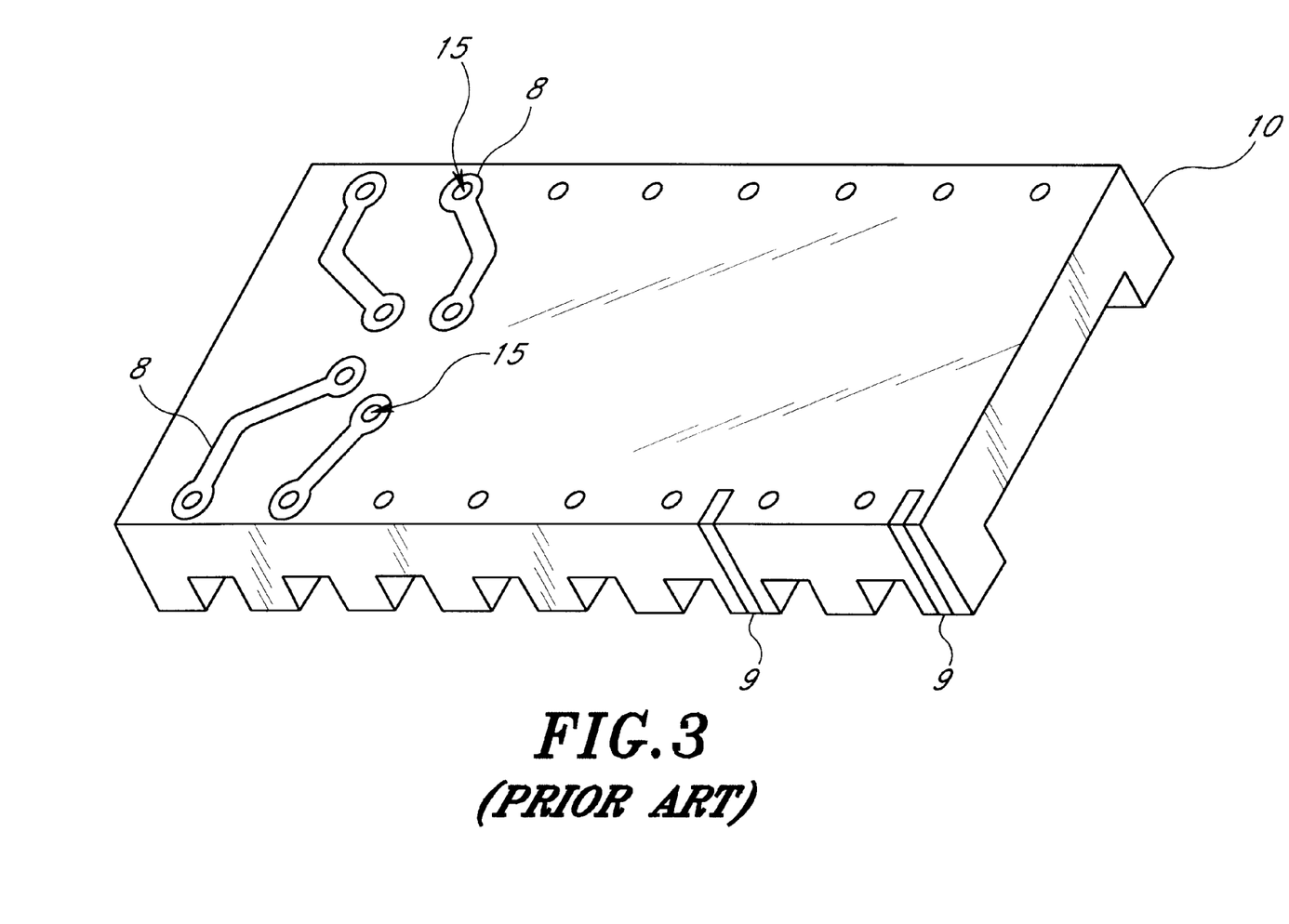
FIG. 3 is a perspective view of a prior art through-hole interconnect device illustrating the bottom surface having printed circuit elements.

A third approach to solving these problems is set forth in U.S. Pat. No. 5,455,741, which discloses a wire-lead through hole interconnect device used for packaging electronic components. As shown in the aforementioned patent and FIGS. 2 and 3 herein, this device is characterized by a non-conductive base 10 with one or more component cavities 6, a plurality of through-holes 15 penetrating the thickness of the base in proximity to the cavities, and recesses 7 at the lower ends of the through holes to receive both electrically conductive printed circuit strips 8 and the solder joint 50 formed between the lead and the conductive strip. Electrical connection between the egress terminals of the package and the component leads 22 is provided by, inter alia, a conductive strip running 9 from the aforementioned solder joint outward around the edge or periphery of the base. This through-hole design provides a flat, "bump-free" bottom surface of the device, and aids the manufacturing and assembly process by allowing greater repeatability and reliability of component placement and joint formation, while reducing the required labor. It also permits the connection between the leads and the egress terminals to be formed more reliably. However, interconnection of the leads from various elements within the device is accomplished through use of the aforementioned conductive strips 8. Hence, to interconnect two electronic element leads, the presence of 1) a second through-hole; 2) a conductive strip; and 3) the recess necessary to receive the conductive strip and the soldered leads is required. Furthermore, two solder joints are required. Similarly, to connect three leads together, three through-holes and three solder joints are required.

It would therefore be desirable to provide a method of connecting two or more of such leads using a single solder joint, such a method furthermore allowing the soldering of all such joints simultaneously in one process step. This would not only save space within the package, but would also eliminate the labor and materials associated with forming the recess(es), installing the printed circuit elements, and soldering each lead individually. Ideally, these joints would be located internally within the package and away from the leadframe elements to minimize any capacitive or electrical interaction between the leads and the egress terminals and to minimize the length of wire runs required to make the connection.

In addition to the foregoing problems associated with lead/lead interconnection, electronic component placement within the package is of concern. The placement of various components is critical from the standpoint of electrical separation (i.e., reducing the interaction of localized electric and magnetic fields emanating from the elements), manufacturing repeatability and reduced labor costs, and device reliability. Heretofore, the placement of electronic elements within the package has been primarily dictated by physical considerations such as reducing the profile or dimensions of the package, and not necessarily with regard to the aforementioned factors. For example, the toroidal coil placement disclosed in the prior art interconnect devices does not specifically address electric or magnetic field interaction, the minimization of wire run length, or physical separation of the elements. Hence, it would be desirable to provide a package design which incorporates both an improved method of lead interconnection as previously described, and improved component placement.

SUMMARY OF THE INVENTION

The present invention satisfies the aforementioned needs by providing an improved microelectronic component package having multi-lead internal interconnect holes, predetermined component placement, and individual component barriers.

In a first aspect of the invention, an improved microminiature electrical interconnect device is disclosed which utilizes one or more through-holes, each hole being designed to accommodate two or more electrical leads, and located in direct proximity to the elements being connected. The leads from these elements are intertwined and placed within the nearest through-hole to a predetermined depth. All leads within the device are set up similarly in their respective through-holes, and ultimately soldered in one step by the method described below. This arrangement obviates the need for any interconnecting printed circuits or recesses therefor, or additional through-holes or solder joints.

In a second aspect of the invention, recesses are formed within the device to accommodate the various microelectronic elements. These recesses include individual barriers to physically separate the elements from one another to minimize electrical or magnetic interaction. The recesses are further disposed within the device so as to both standardize and minimize the length of the lead wire runs between interconnected elements, provide uniform spatial relationship between the elements, and minimize the physical dimensions of the assembled package through efficient use of space.

In a third aspect of the invention, an improved method for forming the aforementioned wire lead joints is disclosed. First, the electronic elements are installed within their respective recesses, their wire leads being intertwined and disposed within nearby through-holes to a predetermined depth. After further assembly, the bottom of the device and protruding intertwined leads are exposed to a mass soldering process (such as dip or wave soldering). Any existing wire insulation on the intertwined leads in the region of the joint is stripped away by the molten solder during the dipping or wave soldering process. Excess flux is then removed using any number of conventional techniques.

These and other objects and features of the present invention will become more fully apparent from the following description and appended claims taken in conjunction with the following drawings.

DETAILED DESCRIPTION OF THE PREFERRED EMBODIMENT

Reference is now made to the drawings wherein like numerals refer to like parts throughout.

Figure 4:
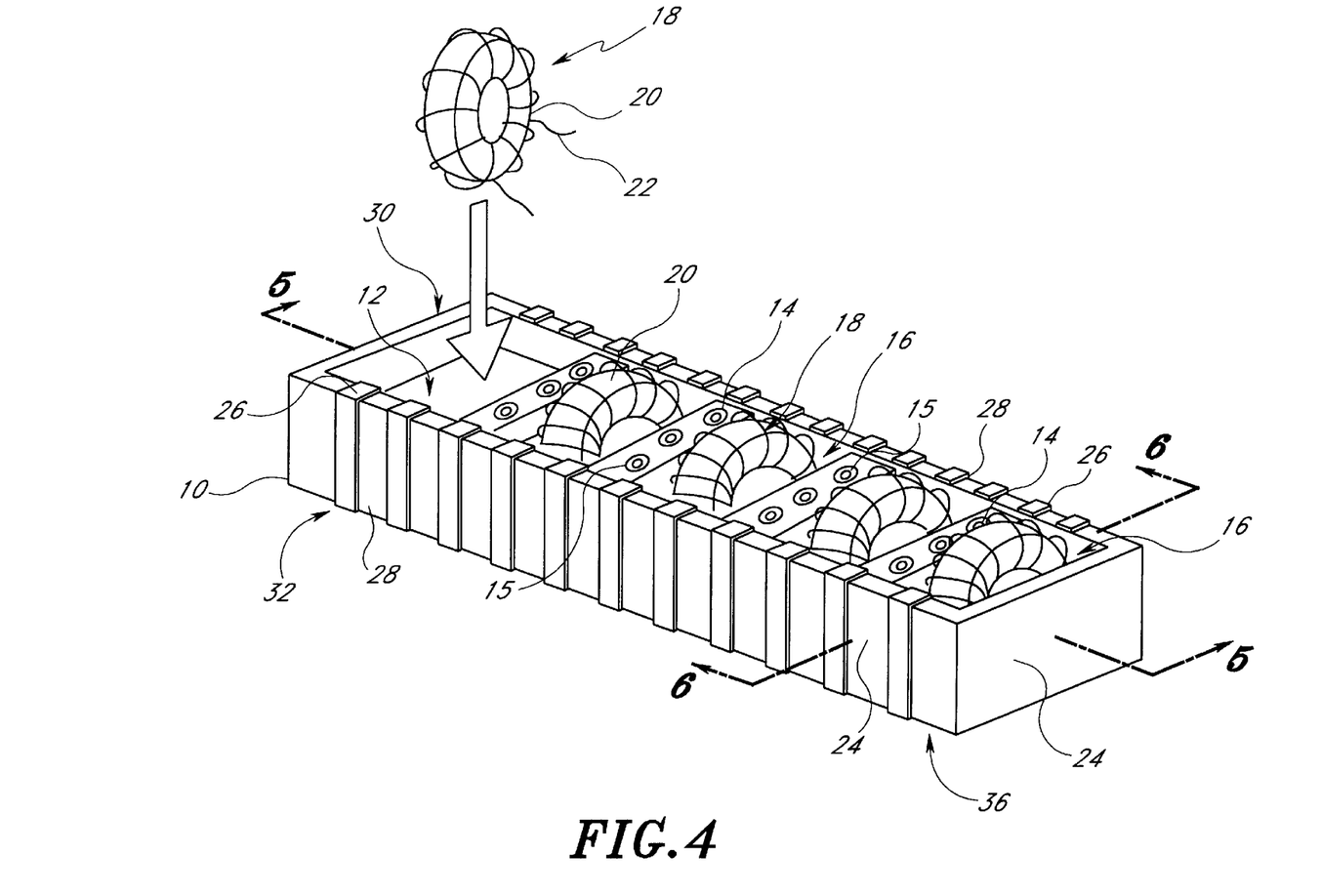
FIG. 4 is a perspective view of a first preferred embodiment of the through-hole interconnect device of the present invention having a plurality of toroidal coils installed therein.

FIG. 4 illustrates a first preferred embodiment of the through-hole interconnect device of the present invention as it is configured prior to final device assembly. As shown in FIG. 4, the through-hole interconnect device is comprised generally of a box-like base member 10 having an internal cavity 12. Within the cavity 12 are disposed one or more element barriers 14 separating the cavity into two or more discrete recesses 16. In this embodiment, each barrier includes one or more through-holes 15, which are described in greater detail below. The individual recesses 16 are shaped to receive any one of a variety of different electronic elements, such as toroidal induction coils 18 as shown in FIG. 4. While the discussion presented herein is specific to the illustrated toroidal induction coils 18, it can be appreciated that a variety of different electronic components may be used in conjunction with the invention with equal success.

An induction coil 18 typically comprises a doughnut shaped iron core member 20 around which are wrapped coils of thin gauge wire, with the ends of the wire extending outward and forming terminal ends or leads 22. The induction coils 18 of the present embodiment are disposed within the cavity 12 and their respective recesses 16 in such a manner that the central axis of each coil element is aligned with that of all other coil elements, as shown in FIG. 4. This arrangement is desirable in that a minimum of space is required to accommodate a given number of coils, and field interactions between each coil element and its neighboring element(s) are generally spatially uniform and consistent from coil to coil. This assists in distributing any potential (voltage) generated by alternating magnetic or electric fields present during operation more evenly along the windings of each element, thereby increasing overall device longevity and permitting "tuning" of the electrical response of the package as a whole. Other coil arrangements which are in keeping with these objectives may be employed, however.

The barriers 14 defining the cavity 12 into individual element recesses 16 are formed or positioned within the cavity to facilitate the foregoing positional relationship of the coil elements 18. In the preferred embodiment, these barriers are integral with the base member 10. The base member is also provided with a plurality of lands 26 and complementary grooves 28 which extend along the top surface 30 and vertically down the sides 32 of the base element 10. These lands 26 and grooves 28 facilitate the connection of the coil element leads 22 to the individual egress terminals 4 of the leadframe terminals according to existing prior art methods as shown in FIG. 1. The base member 10 and barriers 14 are preferably constructed of a suitable molded non-conducting material, such as a high temperature liquid crystal polymer such as that available under the trademark RTP 3407-4, or the equivalent thereof. The material should have a temperature resistance of about four-hundred ninety degrees Fahrenheit or higher for between three to ten seconds. The thickness of the sidewalls 24 of the base member should be on the order of about 0.015 inches minimum.

Figure 5:
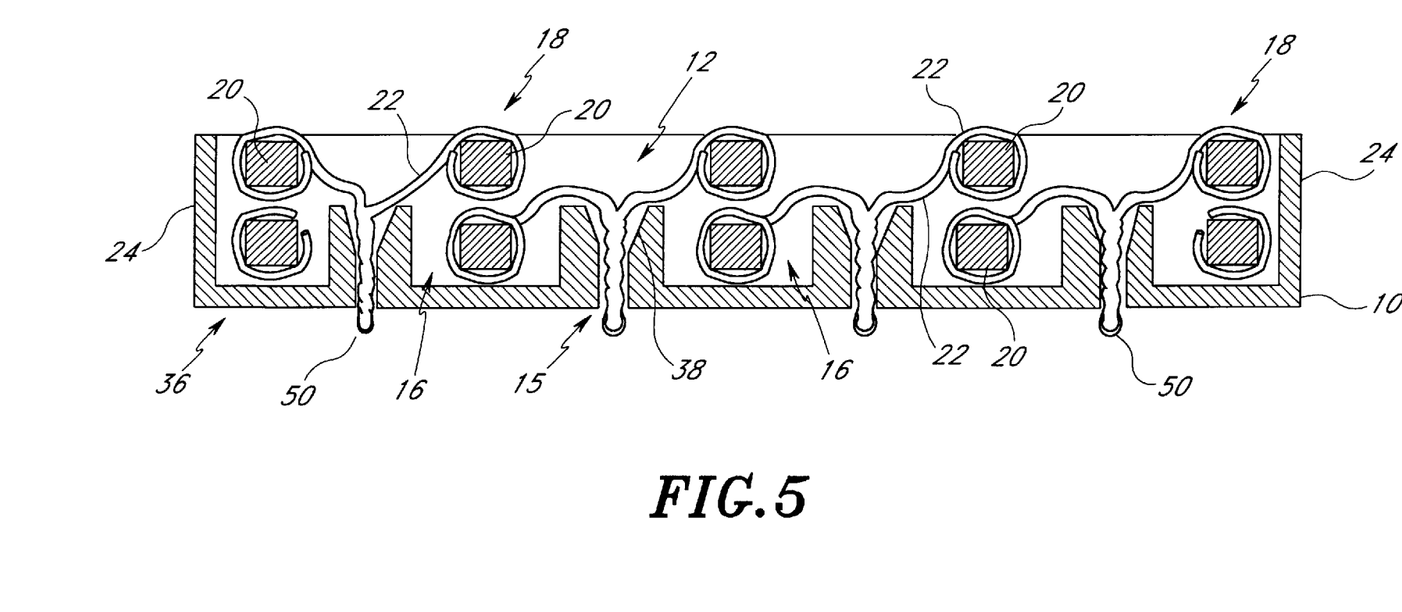
FIG. 5 is a crossectional view of the first preferred embodiment of FIG. 4, taken along line 5—5.
Figure 6:
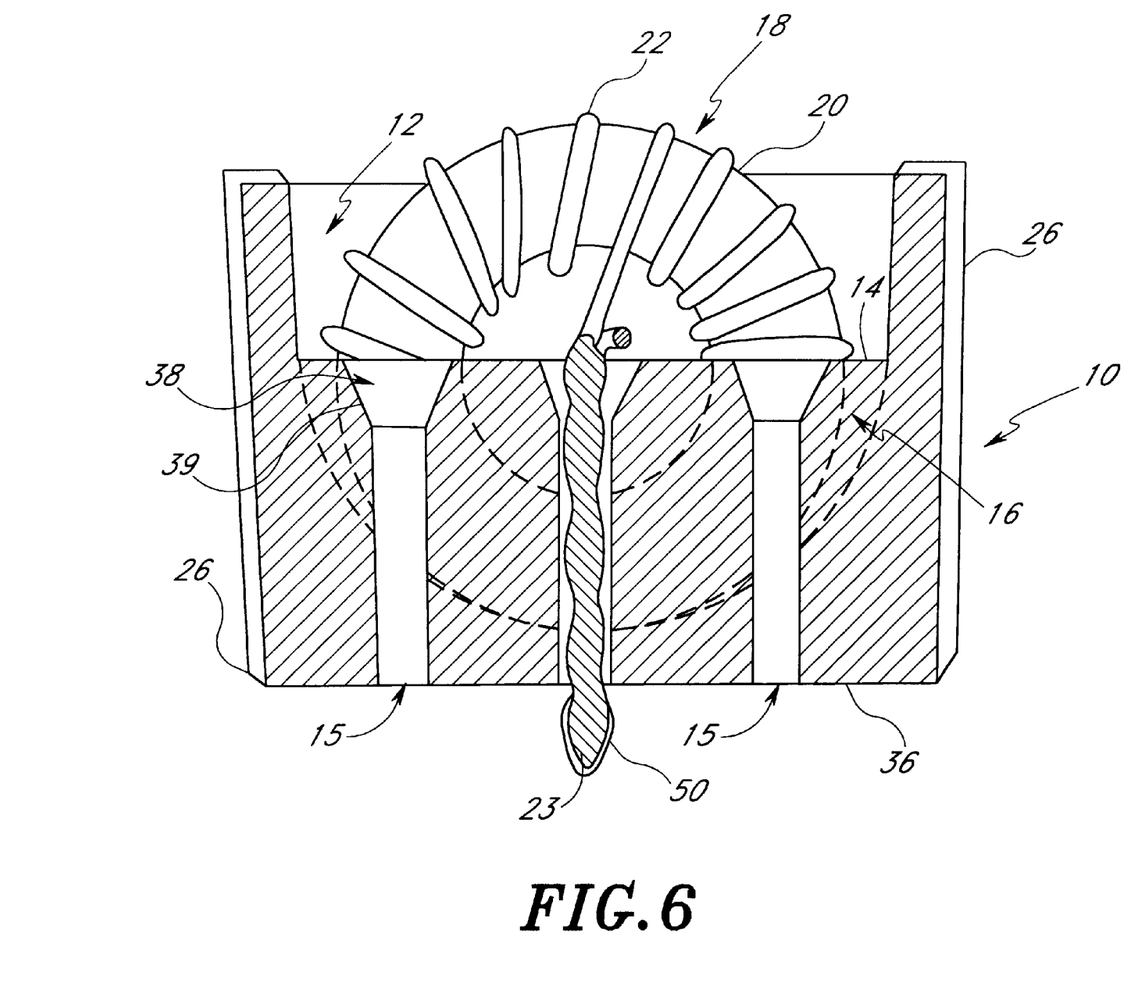
FIG. 6 is a crossectional view of the first preferred embodiment of FIG. 4, taken along line 6—6.

Referring now to FIGS. 5 and 6, it is seen that the recesses 16 in the base element 10 preferably have a depth of roughly half of the overall height of the coil elements 18 and a width which accommodates the positioning of a coil element within the recess 16 without undue lateral play.

In the preferred embodiment, three through holes are provided in each barrier, one of which 15 is illustrated in FIG. 5. These three through holes traverse the vertical thickness of the barrier, forming a passage between the top surface of each barrier and the bottom surface 36 of the base member 10. As will be shown, this arrangement facilitates the electrical interconnection of the leads of one coil element 18 to one or more other elements. Accordingly, through-hole diameter is sized to receive two or more coil leads 22 each with some degree of oversizing. The through-hole length (exclusive of the guide means 38 discussed below) is sized to control the effects of flux wicking up the leads 22 during the soldering process; this length is determined based on the size and number of leads within the through-hole and the characteristics of the flux being used. Typically, a through-hole of length greater than about 0.050in. will be sufficient to mitigate the effects of flux wicking. The leads 22 are twisted together prior to assembly, with the resulting composite lead 23 being threaded through the appropriate hole 15 to a predetermined depth as discussed below. The placement of the holes within the barriers 14 minimizes the extra wire run required to form an interconnection between two or more electronic elements, and helps to mitigate any capacitive effects or coil "bypassing" during operation which may be associated with placing the coil interconnection closer to the leadframe egress terminals 4. However, it can be appreciated that the aforementioned through-holes can be placed at any number of different locations and in a variety of different orientations within the package while still meeting the objectives of the invention.

Additionally, the through-holes 15 of the present embodiment are each provided with guide means 38 which in the illustrated embodiment take the form of semi-conical surfaces 39. As shown in FIGS. 5 and 6, the guide 38 together with the through hole 15 has a typical funnel configuration. These guides enable a quick and easy insertion of the leads of the component into their respective through-holes as the components are placed in their recesses during assembly. This feature helps reduce the labor time required to insert the leads in the through holes, and improves the repeatability and reliability of the manufacturing process. Of course, the guide means 38 can be comprised of any device configuration or other elements which provide for ease of insertion of the leads into their respective through-holes.

Figure 7:
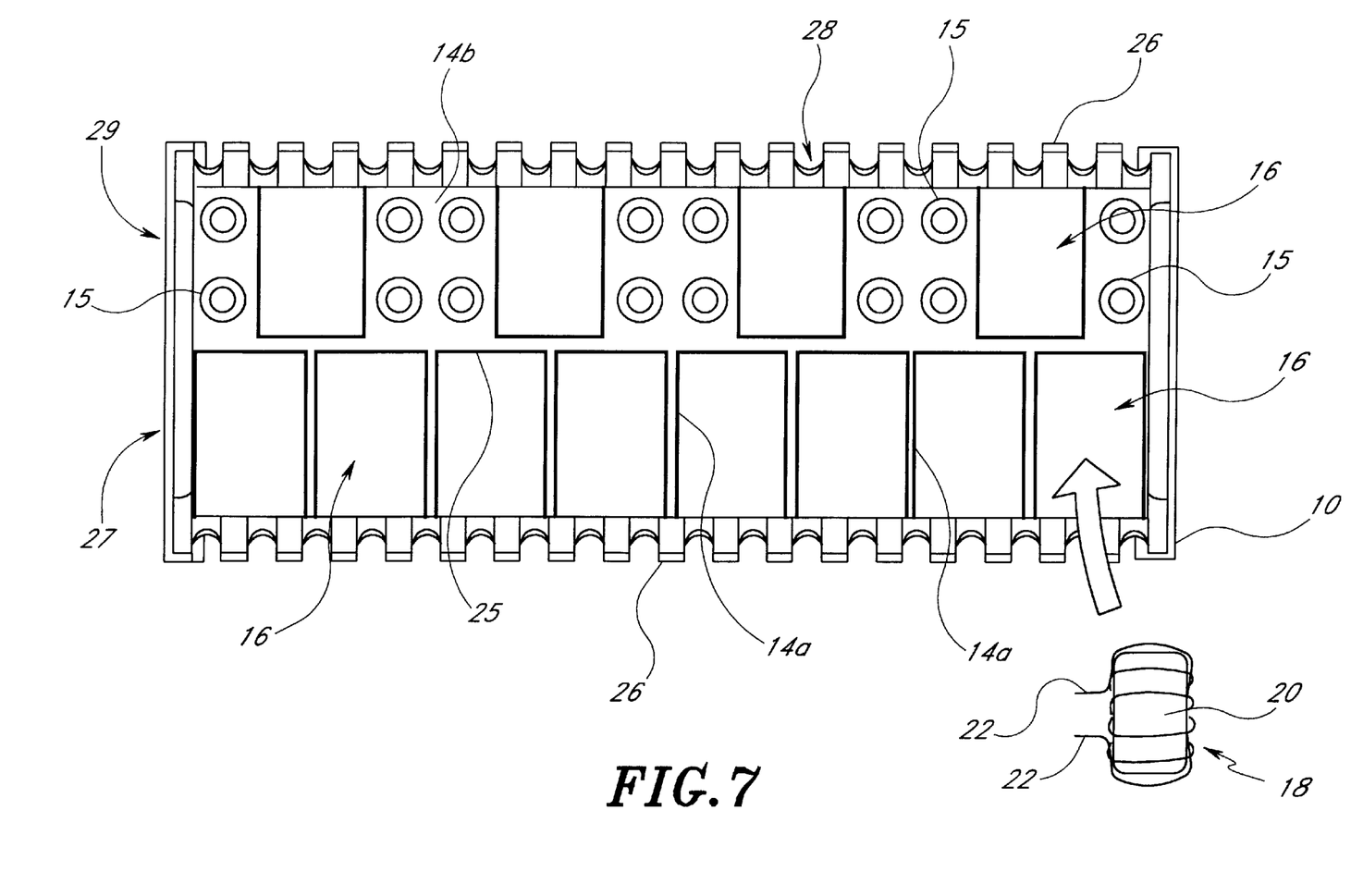
FIG. 7 is an overhead view of a second preferred embodiment of the present invention.

FIG. 7 illustrates a second preferred embodiment of the through-hole interconnect device of the present invention. In this embodiment, a plurality of electronic element recesses 16 are formed within the cavity 12 by barriers 14 configured such that the recesses 16 define in a common orientation and are essentially in two parallel rows 27, 29. Each recess 16 in each row is separated from the next by respective barriers 14*a*, 14*b*, and the first and second row 27, 29 are generally separated by a barrier 25 running the length of the cavity 12. The number of recesses in the first row 27 is less than that for the second row 29 to permit the inclusion of a series of through-holes 15 in the thickened barriers 14*b* of the second row 29. These through-holes allow the interconnection of leads from the various electronic elements 18 installed in the recesses, thereby providing great flexibility in the routing and interconnection of leads during both the design and assembly phases. Furthermore, as in the first embodiment, the through-holes are sufficiently distant from the leadframe terminal grooves 28 so as to minimize any field interaction between the element leads and the terminals.

The method of assembling the through-hole interconnect device of the present invention is now described with reference to FIGS. 4 and 5. First, the coil element leads 22 of the electronic elements to be installed are twisted into lead "groups" to ensure adequate contact. These groups are then inserted into the top of the through-holes 15 such that they protrude slightly below the bottom surface 36 (approximately 0.01–0.05 in.) as shown by arrows 37 in FIG. 6. When all such elements and lead groups have been inserted in their respective recesses and through-holes and are properly positioned, the remaining components including the leadframe terminals 4 are assembled onto the device as described in U.S. Pat. No. 5,015,981, although it can be appreciated that a comparable assembly process may be utilized. Next, the lead groups and leadframe terminals are simultaneously soldered using wave soldering, dip soldering, or other comparable techniques all of which are well understood in the art. Use of these techniques for this application offer the advantages of reduced manufacturing labor and simplified processing, in that no individual joint soldering is required. Furthermore, since the interconnected leads are not rigidly mounted to any portion of the base element 10 as in the prior art methods, the detrimental effects of thermal expansion/contraction during packaging are eliminated since each soldered joint 50 is somewhat free to move both longitudinally and laterally within its respective through-hole 15. This arrangement also provides some degree of mechanical stability to the interconnected leads and solder joints such that undue mechanical stress is not placed on the leads 22 during the assembly or encapsulation process (i.e., the joint is effectively "captured" within its through-hole, thereby lending stability to the connected coil elements 18 and the entire assembly).

Figure 8:
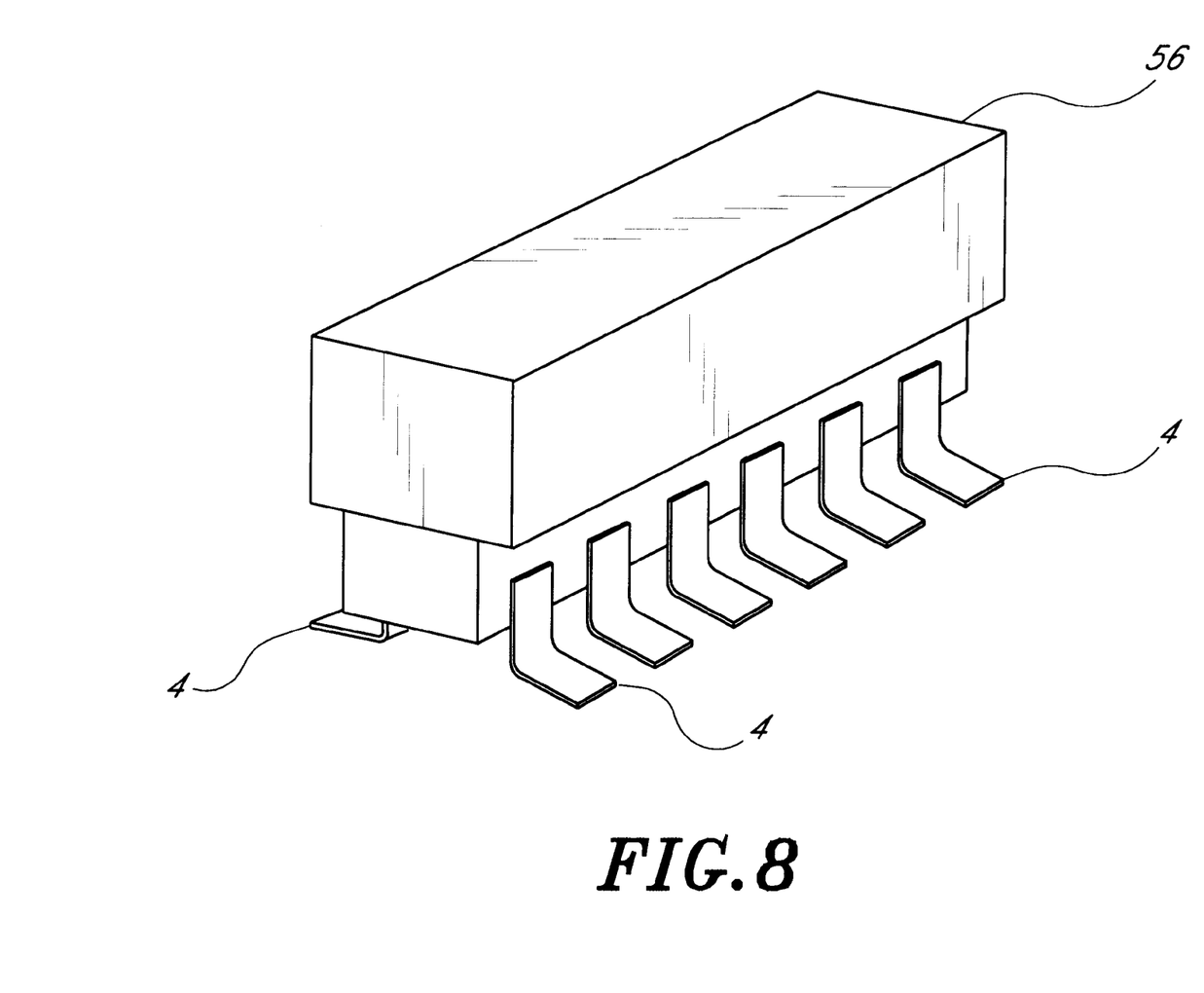
FIG. 8 is a perspective view of the first preferred embodiment of the present invention after encapsulation.

When the aforementioned solder process is completed, the flux is then cleaned with an isopropyl alcohol using an ultrasonic cleaner or comparable means. After the device is inspected, it is then encapsulated in a suitable plastic or polymer material, which material forms a smooth rectangular package as illustrated in FIG. 8. The device is preferably encapsulated in an IC grade thermoset epoxy 56, such as that available from Dexter under the Trademark HYSOL MG25F-05, or equivalent thereof. Thereafter, the lead frame is cut and formed in a die press or the like to finish the egress terminals 4 in a suitable form, for either surface mounting or pin mounting as desired.

While the above detailed description has shown, described, and pointed out the fundamental novel features of the invention as applied to various embodiments, it will be understood that various omissions, substitutions, and changes in the form and details of the device or process illustrated may be made by those skilled in the art without departing from the spirit or essential characteristics of the invention. The described embodiments are to be considered in all respects only as illustrative and not restrictive. The scope of the invention is, therefore, indicated by the appended claims rather than by the foregoing description. All changes which come within the meaning and range of equivalence of the claims are to be embraced within their scope.

What is claimed is:

1. An electronic element interconnect device comprising:
    a base member having bottom and side exterior surfaces, an internal cavity and a plurality of grooves formed on at least a portion of at least one of said exterior surfaces, said grooves being adapted to receive one or more electrical terminals;
    at least one barrier positioned within said cavity so as to form a plurality of recesses in said cavity;
    a plurality of electronic elements positioned in at least one of said plurality of recesses, each of said electronic elements having at least one wire lead; and
    at least one through-hole disposed substantially within said at least one barrier extending between said internal cavity and at least one of said exterior surfaces, said at least one wire lead of two or more of said electronic elements being connected to each other and extending within said at least one through-hole such that said wire leads can move in relation to said at least one through-hole.

2. The interconnect device of claim 1, wherein said base member, said at least one barrier, and said electronic elements are completely encapsulated in a non-conductive material using a molding process.

3. The interconnect device of claim 1, wherein said base member is constructed of a high temperature liquid crystal polymer.

4. The interconnect device of claim 1, wherein said at least one through-hole penetrates said at least one barrier in the region of the intersection of said base member and said at least one barrier.

5. The interconnect device of claim 1, wherein said at least one barrier is integrally formed with said base member.

6. The interconnect device of claim 1, wherein said at least one through-hole is chamfered on at least one end.

7. The interconnect device of claim 1, wherein said connected wire leads extend below the plane of said bottom exterior surface.

8. The interconnect device of claim 7, wherein said connected wire leads are connected by twisting said wire leads together.

9. The interconnect device of claim 8, wherein said connected wire leads are bonded using a soldering process.

10. The interconnect device of claim 9, wherein said soldering process comprises dip soldering.

11. The interconnect device of claim 9, wherein said electronic elements comprise toroidal coils.

12. The interconnect device of claim 1, further comprising a plurality of substantially parallel rows of recesses formed within said cavity, the recesses of at least one of said plurality of rows being separated by said at least one barrier.

13. An interconnect device package, comprising:

a base member having bottom and side exterior surfaces, an internal cavity, and a plurality of grooves formed on at least a portion of said side surfaces a plurality of electrical terminals, said terminals being received within respective ones of said grooves;

at least one barrier positioned within said cavity so as to form a plurality of recesses in said cavity;

a plurality of electronic elements positioned in at least one of said plurality of recesses, each of said electronic elements having at least one wire lead and being electrically connected to at least one of said electrical terminals;

at least one through-hole disposed substantially within said at least one barrier extending between said internal cavity and said bottom surface, said at least one wire lead of two or more of said electronic elements being connected to each other and extending within said at least one through-hole such that said wire leads can move in relation to said at least one through-hole; and an encapsulant, said encapsulant covering at least a portion of said base member and said electrical terminals.

* * * * *